(12) United States Patent
Dede

(10) Patent No.: US 10,945,354 B1
(45) Date of Patent: Mar. 9, 2021

(54) COOLING SYSTEMS COMPRISING FLUID DIODES WITH VARIABLE DIODICITY FOR TWO-PHASE FLOW CONTROL

(71) Applicant: Toyota Motor Engineering & Manufacturing North America, Inc., Plano, TX (US)

(72) Inventor: Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/776,960

(22) Filed: Jan. 30, 2020

(51) Int. Cl.
H05K 7/20 (2006.01)
(52) U.S. Cl.
CPC ..... H05K 7/20272 (2013.01); H05K 7/20263 (2013.01)
(58) Field of Classification Search
CPC .............. H05K 7/20272; H05K 7/20263
See application file for complete search history.

(56) References Cited

U.S. PATENT DOCUMENTS

| 5,303,275 | A | 4/1994 | Kobsa |
| 8,716,689 | B2 | 5/2014 | Chen et al. |
| 8,904,808 | B2 | 12/2014 | Ghoshal et al. |
| 9,169,855 | B1 | 10/2015 | Dyson |
| 9,903,536 | B2 | 2/2018 | Lin et al. |
| 2004/0069457 | A1* | 4/2004 | Park ............ F28D 15/043 165/104.21 |
| 2008/0308258 | A1* | 12/2008 | Pan ............ H01L 23/473 165/104.19 |
| 2015/0260181 | A1* | 9/2015 | Harvey ............ F04B 45/043 417/410.1 |

(Continued)

FOREIGN PATENT DOCUMENTS

| JP | 2006046304 A | 2/2006 |
| KR | 101796450 B1 | 11/2017 |

OTHER PUBLICATIONS

Porwal, Piyush, R. et al., "Heat transfer and fluid flow characteristics in multistaged Tesla valves", An International Journal of Computation and Methodology, Mar. 26, 2018, p. 347-365, vol. 73, Issue 6.

(Continued)

*Primary Examiner* — Mukundbhai G Patel
(74) *Attorney, Agent, or Firm* — Dinsmore & Shohl LLP

(57) ABSTRACT

A microchannel two-phase cooling apparatus includes a cooling manifold and a fluid diode array. The cooling manifold includes one or more fluid inlets, one or more fluid outlets, and a plurality of fluid channels extending between and fluidly coupling the one or more fluid inlets and the one or more fluid outlets. The fluid diode array includes a plurality of fluid diodes positioned within the cooling manifold. Individual fluid diodes of the fluid diode array are fluidly coupled to individual fluid channels. The fluid diode array includes a first set of fluid diodes having a first average diodicity and a second set of fluid diodes having a second average diodicity. The first average diodicity is greater than the second average diodicity and each individual fluid diode of the first set of fluid diodes has a greater diodicity than any individual fluid diode of the second set of fluid diodes.

20 Claims, 5 Drawing Sheets

(56) References Cited

U.S. PATENT DOCUMENTS

2016/0061385 A1* 3/2016 Lin .......................... F15D 1/02
137/15.01

OTHER PUBLICATIONS

De Vries, S. F. et al., "Design and operation of a Tesla-type valve for pulsating heat pipes", International Journal of Heat and Mass Transfer, Sep. 23, 2016, p. 1-11, vol. 105.

* cited by examiner

COOLING SYSTEMS COMPRISING FLUID DIODES WITH VARIABLE DIODICITY FOR TWO-PHASE FLOW CONTROL

TECHNICAL FIELD

The present specification generally relates to cooling structures and, more specifically, to cooling structures utilizing two-phase flow control with fluid diodes.

BACKGROUND

Heat sinking devices may be coupled to a heat-generating device, such as a power electronics device, to remove heat and lower the maximum operating temperature of the heat-generating device. Cooling fluid may be used to receive heat generated by the heat-generating device by convective thermal transfer, and remove such heat from the heat-generating device. For example, cooling fluid may be directed toward a semiconductor-cooling chip to remove heat from the heat-generating device. For small electronic devices such as integrated circuits, a microchannel heat sink may be used to accommodate the small size of these devices.

Two-phase cooling devices use a cooling fluid at or near saturation such that, as heat is removed from the heat-generating device, the cooling fluid is allowed to boil such that heat may be stored in the latent heat of the cooling fluid. This allows for a greater amount of heat to be transferred from the heat-generating device. However, in microchannel two-phase cooling configurations, boiling instabilities may cause fluid backflow in the cooling device. This fluid backflow may significantly deteriorate the cooling performance of the microchannel cooling device.

Accordingly, a need exists for alternative microchannel two-phase cooling apparatus to reduce fluid backflow.

SUMMARY

In one embodiment, a microchannel two-phase cooling apparatus includes a cooling manifold and a fluid diode array. The cooling manifold includes one or more fluid inlets, one or more fluid outlets, and a plurality of heat sink fluid channels extending between and fluidly coupling the one or more fluid inlets and the one or more fluid outlets. The fluid diode array includes a plurality of fluid diodes positioned within the cooling manifold. Individual fluid diodes of the fluid diode array are fluidly coupled to channel inlets of individual heat sink fluid channels of the plurality of heat sink fluid channels. The fluid diode array includes a first set of fluid diodes having a first average diodicity and a second set of fluid diodes having a second average diodicity. The first average diodicity is greater than the second average diodicity and each individual fluid diode of the first set of fluid diodes has a greater diodicity than any individual fluid diode of the second set of fluid diodes.

In another embodiment, a cooling system includes a heat generating electronic device and a microchannel two-phase cooling apparatus. The microchannel two-phase cooling apparatus includes a cooling manifold and a fluid diode array. The cooling manifold includes one or more fluid inlets, one or more fluid outlets, and a plurality of heat sink fluid channels extending between and fluidly coupling the one or more fluid inlets and the one or more fluid outlets. The fluid diode array includes a plurality of fluid diodes positioned within the cooling manifold. Individual fluid diodes of the fluid diode array are fluidly coupled to channel inlets of individual heat sink fluid channels of the plurality of heat sink fluid channels. The fluid diode array includes a first set of fluid diodes having a first average diodicity and a second set of fluid diodes having a second average diodicity. The first average diodicity is greater than the second average diodicity and each individual fluid diodes of the first set of fluid diodes has a greater diodicity than any individual fluid diode of the second set of fluid diodes.

In another embodiment, a method of cooling a heat generating device includes pumping a fluid through a cooling manifold of a microchannel two-phase cooling apparatus thermally coupled to the heat generating device using a pump fluidly coupled to the cooling manifold, thereby removing heat from the heat generating device and storing energy of the removed heat in latent heat of the fluid. The cooling manifold includes one or more fluid inlets, one or more fluid outlets, and a plurality of heat sink fluid channels extending between and fluidly coupling the one or more fluid inlets and the one or more fluid outlets. The microchannel two-phase cooling apparatus further includes a fluid diode array including a plurality of fluid diodes positioned within the cooling manifold. Individual fluid diodes of the fluid diode array are fluidly coupled to channel inlets of individual heat sink fluid channels of the plurality of heat sink fluid channels. The fluid diode array includes a first set of fluid diodes having a first average diodicity and a second set of fluid diodes having a second average diodicity. The first average diodicity is greater than the second average diodicity and each individual fluid diode of the first set of fluid diodes has a greater diodicity than any individual fluid diode of the second set of fluid diodes.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
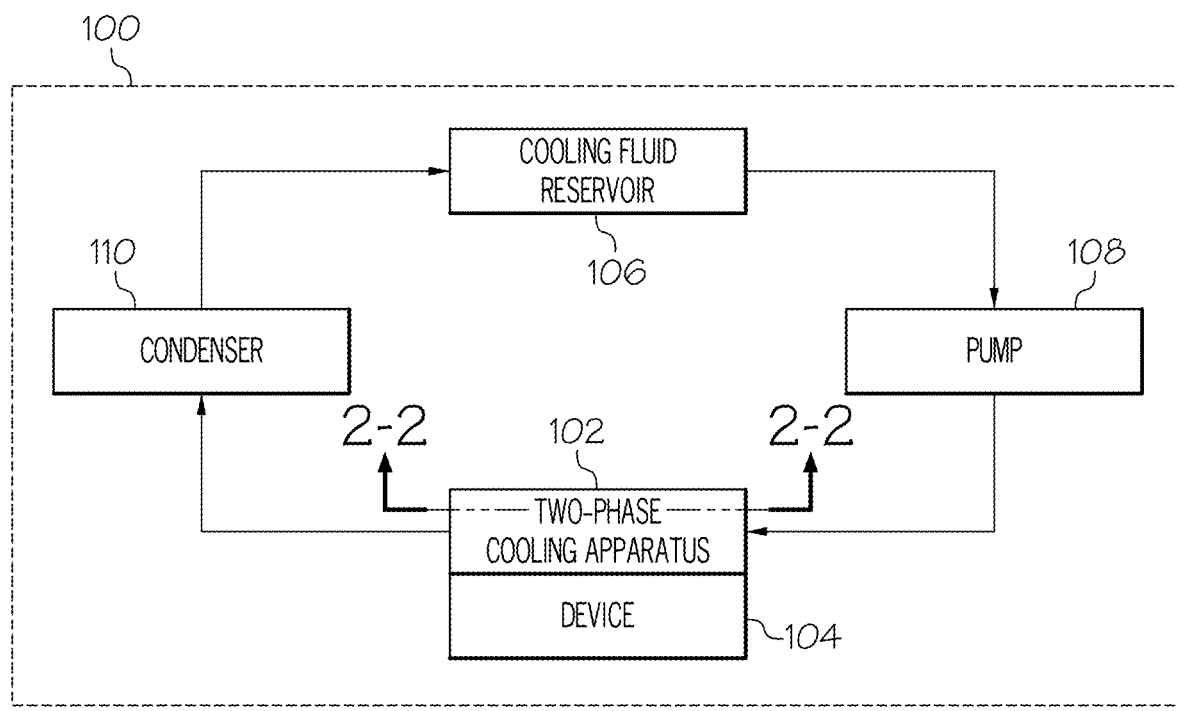
FIG. 1 schematically depicts a view of an example cooling system having a microchannel two-phase cooling apparatus, according to one or more embodiments shown or described herein.

Embodiments described herein generally relate to cooling systems that include a microchannel two-phase cooling apparatus. The microchannel two-phase cooling apparatus includes a cooling manifold with heat sink fluid channels that may be positioned adjacent to a power electronics device such as a semiconductor. The cooling manifold receives a dielectric cooling fluid that cools the semiconductor. The cooling manifold comprises a microchannel array of heat sink fluid channels through which the cooling fluid flows. As the cooling fluid flows through the array of heat sink fluid channels, heat is transferred from the power electronics device to the cooling fluid. In a two-phase cooling apparatus, the cooling fluid may be near saturation as it moves through the heat sink fluid channels. Thus, as heat is transferred from the power electronics device to the cooling fluid, the cooling fluid may begin to boil, thereby allowing energy to be stored in the latent heat of the cooling fluid. However, as the cooling fluid begins to boil, boiling instabilities may cause the cooling fluid to reverse direction and backflow through the heat sink fluid channels, which can deteriorate the cooling performance of the cooling system.

Thus, the cooling manifold described herein is configured to reduce backflow of the cooling fluid. Specifically, an array of fluid diodes is positioned at the channel inlets of the array of heat sink fluid channels to ensure that the cooling fluid prefers to flow in the proper forward direction and does not backflow. Because fluid backflow is more likely to occur at certain locations of the cooling manifold than others, the fluid diodes may have variable diodicities at the channel inlets to different heat sink fluid channels. Embodiments of cooling systems that include fluid diode arrays will now be described and, whenever possible, the same reference numerals will be used throughout the drawings to refer to the same or like parts.

Referring to FIG. 1, a cooling system 100 for cooling electronic devices, such as power electronic devices is shown. The cooling system 100 comprises a microchannel two-phase cooling apparatus 102 thermally coupled to a heat generating electronic device 104. As used herein, the term "thermally coupled" refers to two or more components in thermal communication such that heat is transferable from the hotter component to the colder of the one or more components by one or more thermal transfer means (e.g., thermal conductivity, thermal radiation, or thermal convection). For example, the microchannel two-phase cooling apparatus 102 may be positioned adjacent to or in contact with the heat generating electronic device 104. In some embodiments, heat generating electronic device 104 is a power semiconductor device. Non-limiting examples of power semiconductor devices that may be cooled by the cooling system 100 described herein include, but are not limited to, SiC semiconductors, GaN semiconductors, or other types of semiconductor devices that provide large bandgaps, high breakdown voltages, and high thermal conductivity. Implementations of power semiconductors may include, but are not limited to, bipolar junction transistors (BJTs), insulated-gate bipolar transistors (IGBTs), and power metal-oxide-semiconductor field-effect transistors (MOSFETs). Power semiconductors may be used in inverters and converters in electrified vehicles. Power semiconductor devices may be capable of greater capacity in particular aspects than other semiconductor devices, such as higher blocking voltages, higher switching frequencies, and higher junction temperatures. Consequently, they may also require greater cooling capacity. Thus, in the embodiments described herein, the microchannel two-phase cooling apparatus 102 is provided to remove heat from the heat generating electronic device 104.

As depicted in FIG. 1, the cooling system 100 further includes a cooling fluid reservoir 106 that houses a cooling fluid (e.g., water or other dielectric cooling fluid), a pump 108 that pumps cooling fluid from the cooling fluid reservoir 106 through the microchannel two-phase cooling apparatus 102, and a condenser 110 configured to cool heated cooling fluid that exits the microchannel two-phase cooling apparatus 102. As depicted in FIG. 1, the microchannel two-phase cooling apparatus 102 is fluidly coupled to the cooling fluid reservoir 106, the pump 108, and the condenser 110. In operation, the cooling fluid is pumped from the cooling fluid reservoir 106 into the microchannel two-phase cooling apparatus 102 in a liquid phase, which may heat to saturation in the microchannel two-phase cooling apparatus 102. Thus, as the cooling fluid moves through the microchannel two-phase cooling apparatus 102 in a liquid phase, the heat from the adjacent heat generating electronic device 104 causes the cooling fluid to begin to boil. This causes heat to be transferred from the heat generating electronic device 104 to the latent heat of the cooling fluid, which exits the microchannel two-phase cooling apparatus 102 in a gas phase, or a combination of a liquid phase and a gas phase. After exiting the microchannel two-phase cooling apparatus 102, the cooling fluid enters the condenser 110. The condenser 110 condenses the cooling fluid and cools it back to a temperature near the saturation temperature of the cooling fluid, thereby returning the cooling fluid to a single, liquid phase. The cooling fluid then re-enters the cooling fluid reservoir 106 and this cycle is repeated, thereby allowing heat to be continually removed from the heat generating electronic device 104.

Figure 2:
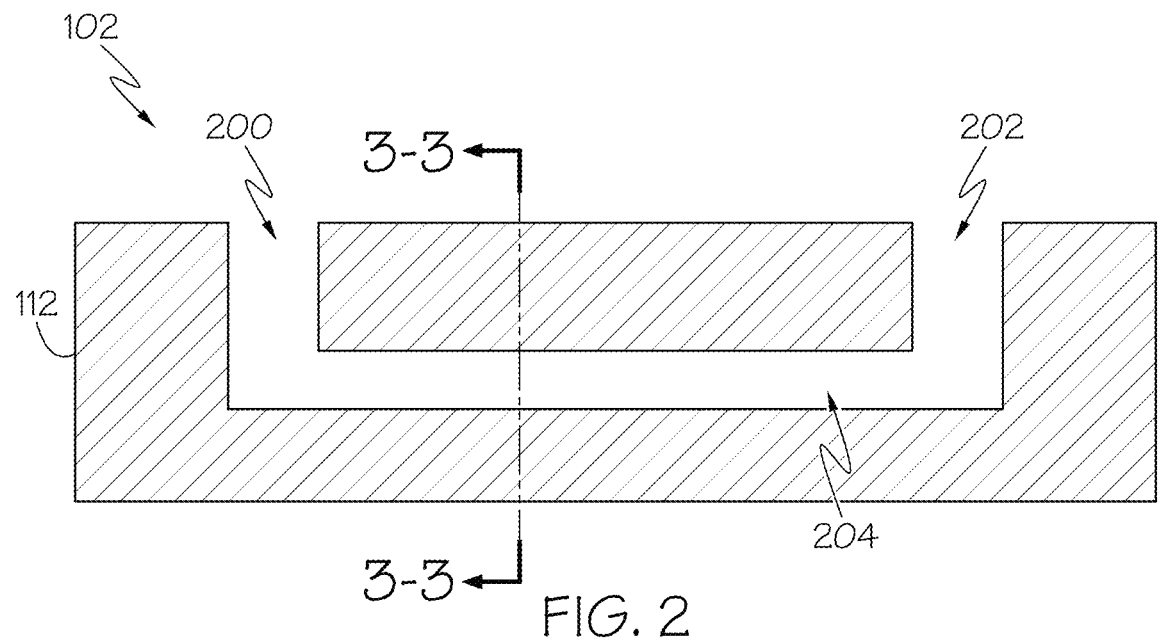
FIG. 2 shows a cross-sectional view through line 2-2 of the cooling apparatus of FIG. 1, according to one or more embodiments shown or described herein.

Referring to FIG. 2, a cross-sectional side view of the microchannel two-phase cooling apparatus 102 is shown through line 2-2 of FIG. 1. The microchannel two-phase cooling apparatus 102 comprises a cooling manifold 112 having a fluid inlet 200, a fluid outlet 202, and a fluid microchannel passageway 204 extending between the fluid inlet 200 and the fluid outlet 202. As cooling fluid is pumped through the microchannel two-phase cooling apparatus 102, the cooling fluid enters the cooling manifold 112 through the fluid inlet 200, moves through the fluid microchannel passageway 204, and exits the cooling manifold 112 through the fluid outlet 202.

Figure 3:
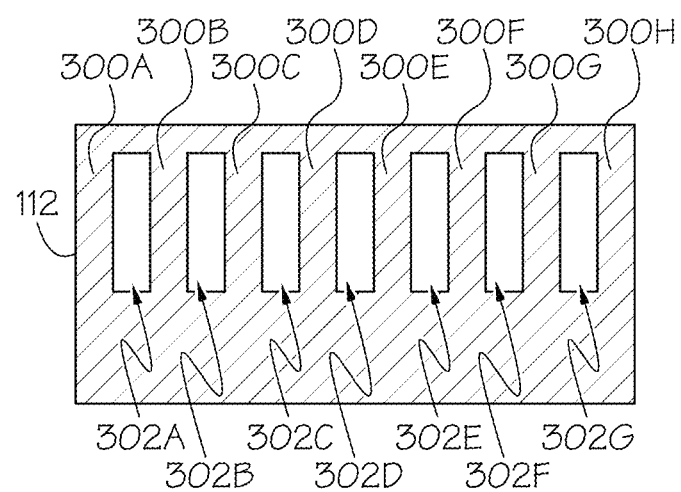
FIG. 3 shows a cross-sectional view through line 3-3 of the cooling manifold of FIG. 2, according to one or more embodiments shown or described herein.

Referring to FIG. 3, a cross-sectional front view of the cooling manifold 112 is shown through the line 3-3 of FIG. 2. The cooling manifold 112 comprises a plurality of projections (e.g., walls or heat sink fins) 300 (e.g., 300A-300G as shown in FIG. 3) disposed within the fluid microchannel passageway 204. The projections 300 define a plurality of openings or heat sink fluid channels 302 (e.g., 302A-302F as shown in FIG. 3) through the fluid microchannel passageway 204. In some embodiments, the heat sink fluid channels 302 comprise linear channels. In other embodiments, the heat sink fluid channels 302 comprise wavy, serpentine, or otherwise non-linear but periodically repeating channels.

The heat sink fluid channels 302 fluidly couple the fluid inlet 200 of the cooling manifold 112 to the fluid outlet 202 of the cooling manifold 112. In particular, the heat sink fluid channels 302 comprise a channel inlet 301 that fluidly couples the heat sink fluid channels 302 to the fluid inlet 200 and a channel outlet 303 that fluidly couples the heat sink fluid channels 302 to the fluid outlet 202. Thus, as cooling fluid enters the cooling manifold 112 through the fluid inlet 200, the cooling fluid is dispersed through each of the heat sink fluid channels 302. In the illustrated example of FIG. 3, 7 projections 300A-300G and 6 heat sink fluid channels 302A-302F are shown. However, it should be understood that the cooling manifold 112 may comprise any number of projections 300 and heat sink fluid channels 302.

As the cooling fluid moves through the heat sink fluid channels 302, the cooling fluid begins to pick up heat and boil and at least partially turn into vapor. This creates a greater rate of heat transfer from the heat generating electronic device 104 to the cooling fluid than would occur in a single-phase cooling system where the cooling fluid does not undergo a phase change. However, as the cooling fluid begins to boil, boiling instabilities may cause fluid backflow in one or more of the heat sink fluid channels 302. This fluid backflow may deteriorate the cooling performance of the cooling manifold 112. Thus, it is desirable to avoid any such cooling fluid backflow.

Figure 4A:
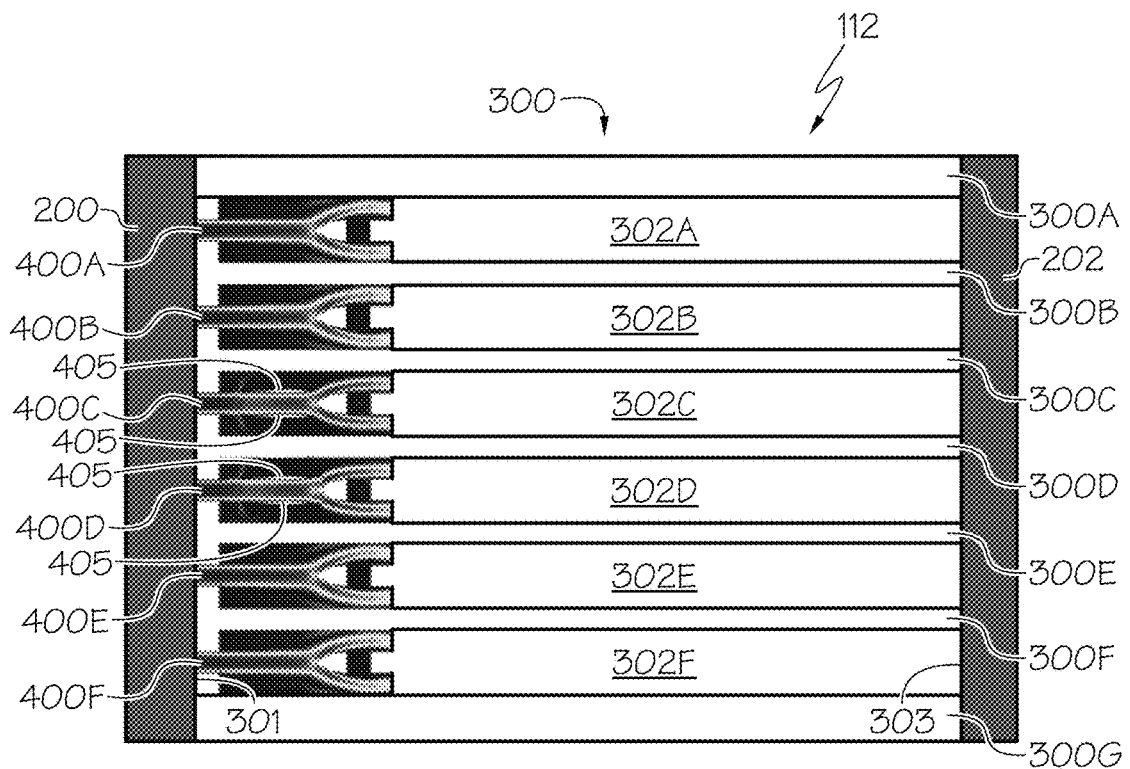
FIG. 4A shows a plan view of an example fluid diode array in forward flow mode positioned within the cooling manifold of FIG. 3, according to one or more embodiments shown or described herein.
Figure 4B:
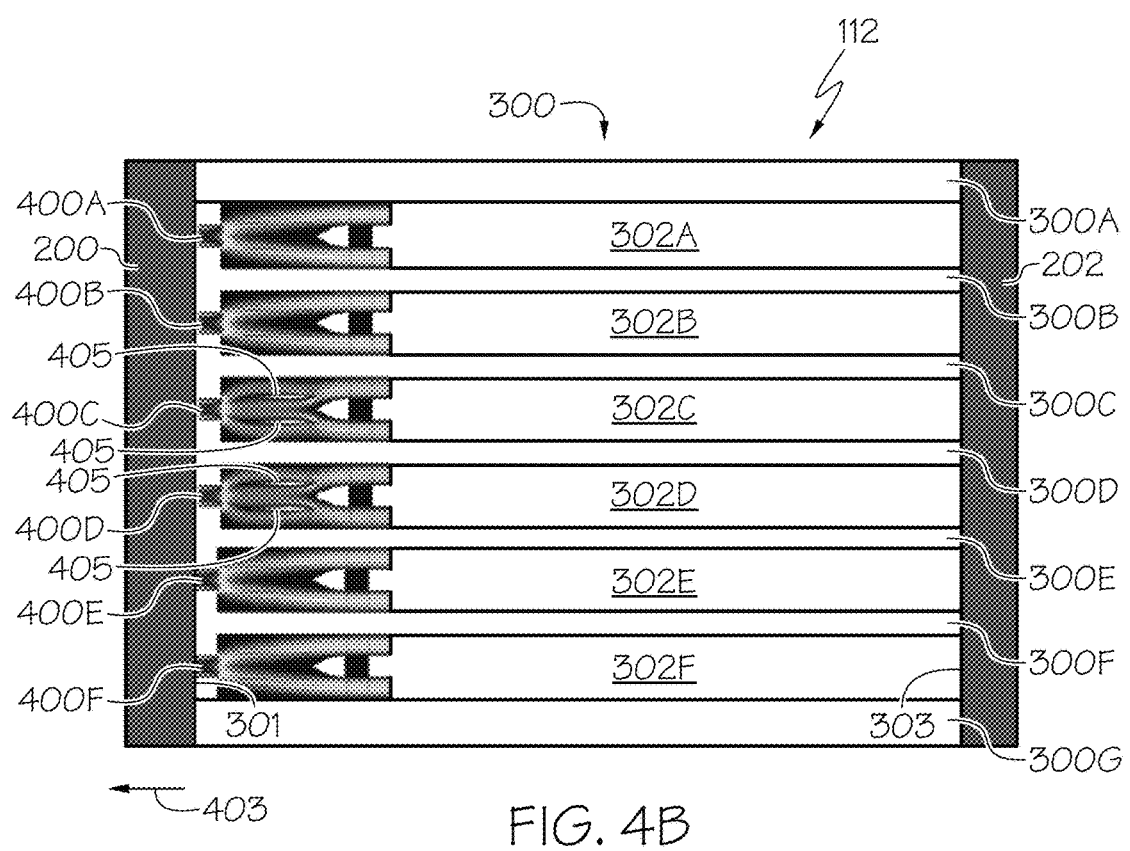
FIG. 4B shows a plan view of the fluid diode array of FIG. 4A in reverse flow mode, according to one or more embodiments shown or described herein.

Referring also to FIGS. 4A and 4B, the microchannel two-phase cooling apparatus 102 may further comprise a fluid diode array 400 comprising a plurality of fluid diodes (e.g., fluid diodes 400A-400F) positioned at the channel inlet 301 of the heat sink fluid channels 302 (e.g., heat sink fluid channels 302A-302F) to restrict cooling fluid backflow. A fluid diode, sometimes referred to as a tesla valve, is a device that allows fluid to preferentially flow in one direction. That is, fluid easily flows through a fluid diode in one direction (the forward flow direction) but does not easily flow through the fluid diode in the opposite direction (the reverse flow direction). More specifically, a fluid diode has a higher pressure drop for fluid flow in the reverse flow direction (the reverse pressure drop) than for fluid flow in the forward flow direction (the forward pressure drop). The ratio of the reverse pressure drop to the forward pressure drop for identical flow rates through a fluid diode is known as the diodicity of the fluid diode. The diodicity gives a measure of how difficult it is for fluid to flow through a fluid diode in the reverse flow direction as compared to the forward flow direction. In the example of FIG. 4A, fluid flows in the forward direction, as shown by arrow 401. In the example of FIG. 4B, fluid flows in the reverse direction, as shown by arrow 403.

By positioning the fluid diode array 400 at the channel inlet 301 of the heat sink fluid channels 302, fluid flow through the cooling manifold 112 in the forward direction (i.e., a direction from the fluid inlet 200 to the fluid outlet 202) may be permitted while fluid flow in the reverse direction (i.e., a direction from the fluid outlet 202 to the fluid inlet 200) may be restricted. However, the fluid diodes 400 add a pressure drop in both directions. Thus, positioning the fluid diodes 400 in the heat sink fluid channels 302 of the cooling manifold 112 adds a pressure drop across each heat sink fluid channel 302 where a fluid diode 400 is positioned, which may reduce the efficiency of the microchannel two-phase cooling apparatus 102. Furthermore, the higher the diodicity of a fluid diode, the greater the pressure drop will be through that heat sink fluid channel. Thus, it is desirable to use fluid diodes with a diodicity only as large as needed to effectively restrict fluid backflow.

For many power electronics devices, heat is generated non-uniformly across the device and the heat generated by the operation of the heat generating electronic device 104 will be concentrated toward the center of the device. Thus, as cooling fluid is pumped through the cooling manifold 112 adjacent to the heat generating electronic device 104, boiling instabilities and fluid backflow will be concentrated toward the center of the of the cooling manifold 112. Accordingly, fluid diodes with higher diodicities may be placed in the heat sink fluid channels near the center of the cooling manifold 112 and fluid diodes with lower diodicities may be placed in the heat sink fluid channels on the sides of the cooling manifold 112. This may provide the least amount of pressure drop through the cooling manifold 112 while still restricting fluid backflow.

In embodiments where the heat generating electronic device 104 has a different heating profile (i.e., locations other than the center of the heat generating electronic device 104 tend to heat up more during operation), fluid diodes may be positioned at the channel inlets 301 of the heat sink fluid channels 302 of the cooling manifold 112 in a manner corresponding to the heating profile of the heat generating electronic device 104. That is, heat sink fluid channels 302 adjacent to high heat regions, i.e. portions of the heat generating electronic device 104 that tend to heat up by a greater amount, may have fluid diodes 400 with a higher diodicity placed therein and heat sink fluid channels 302 adjacent to portions of the heat generating electronic device 104 that tend to heat up by a lesser amount may have fluid diodes with a lower diodicity placed therein.

Referring still to FIGS. 4A and 4B, a plan view of the cooling manifold 112 is shown depicting the fluid diode array 400. In the example of FIGS. 4A and 4B, the fluid diode array 400 is shown as having six fluid diodes 400A, 400B, 400C, 400D, 400E, 400F positioned at the channel inlets 301 of heat sink fluid channels 302A, 302B, 302C, 302D, 302E, 302F, respectively, for purposes of illustration. However, it should be understood that the fluid diode array 400 may comprise any number of fluid diodes at the channel inlets 301 of any number of heat sink fluid channels 302. In some embodiments, the number of fluid diodes in the fluid diode array 400 is equal to the number of heat sink fluid channels 302 in the cooling manifold 112. In these embodiments, each fluid diode of the fluid diode array 400 may be positioned at the channel inlet 301 of a heat sink fluid channel 302 between adjacent projections 300 (e.g., fins or walls) of the cooling manifold 112.

In the example depicted in FIGS. 4A and 4B, a first set of fluid diodes comprising the fluid diodes 400A, 400B, 400E, 400F are positioned at the channel inlets 301 of heat sink fluid channels 302 adjacent to the side portions of the heat generating electronic device 104 and a second set of fluid diodes comprising the fluid diodes 400C, 400D are positioned at channel inlets 301 of the heat sink fluid channels 302 adjacent to the center portion of the heat generating electronic device 104. In this example embodiment, the center portion of the heat generating electronic device 104 generates more heat than the side portion of the heat generating electronic device 104. To manage this heat differential, the first set of fluid diodes have a higher diodicity than the second set of fluid diodes. In particular, the first set of fluid diodes have a first average diodicity and the second set of fluid diodes have a second average diodicity higher than the first average diodicity. The diodicity of each fluid diode 400A, 400B, 400E, 400F is less than the diodicity of fluid diode 400C and less than the diodicity of fluid diode 400D. Indeed, the fluid diodes 400C, 400D may have additional flow features 405 (e.g., internal walls or chambers), which cause those fluid diodes to have an increased diodicity compared to the fluid diodes 400A, 400B, 400E, 400F.

In some embodiments, each of the fluid diodes 400A, 400B, 400E, 400F have the same diodicity as each other (a lower diodicity) and the fluid diodes 400C, 400D have the same diodicity as each other (a higher diodicity). In one example embodiment, the fluid diodes 400A, 400B 400E. 400F each have a diodicity of about 5 and the fluid diodes 400C, 400D each have a diodicity of about 15. In other embodiments, fluid diodes may be arranged with functionally-graded (e.g., parabolically varying) diodicities. For example, the diodicities of the fluid diodes may gradually increase or decrease such that the diodicities change along a functional gradient where higher diodicity fluid diodes are located adjacent hotter regions of the heat generating electronic device 104 and lower diodicity fluid diodes are located adjacent hotter regions. In this embodiment, the first set of fluid diodes and second set of fluid diodes are defined in reference to a diodicity threshold. As an illustrative example, the diodicity of the fluid diode array may increase parabolically from a diodicity of 5 at the channel inlets 301 of heat sink fluid channels 302 adjacent to the side portions of the heat generating electronic device 104 to a diodicity of 15 at the channel inlets 301 of heat sink fluid channels 302 adjacent to the center of the heat generating electronic device 104. In this illustrative example, the diodicity threshold may be 10, such that fluid diodes with a diodicity of 10 or greater are classified as the first set of fluid diodes and fluid diodes with a diodicity of less than 10 are classified as the second set of fluid diodes.

In some embodiments, the first set of fluid diodes are contiguous and the second set of fluid diodes are contiguous. However, in other embodiments, either the first set of fluid diodes or the second set of fluid diodes may be non-contiguous. Moreover, one or more additional sets of fluid diodes having different average diodicities may be included in the fluid diode array 400 to match the heating profile of the heat generating electronic device 104.

In operation, because the second set of fluid diodes positioned in the center of the fluid diode array 400 have a higher average diodicity than the first set of fluid diodes positioned at the outsides of the fluid diode array 400, fluid flow and backflow is restricted to a greater degree through the center of the cooling manifold 112 than along the sides of the cooling manifold 112. As a result, a greater amount of fluid may travel to the outer edges of the heat sink, and to adjust for this, an equivalent fluid resistance feature (not shown) may be added to the outer channels to ensure uniform flow distribution. Such an arrangement may be desirable when the heat generating electronic device 104 tends to heat up to a greater degree near its center than at its side portions. However, it should be understood that if the heat generating electronic device 104 has a different heating profile, a different arrangement of the fluid diodes of the fluid diode array 400 may be used.

Figure 5A:
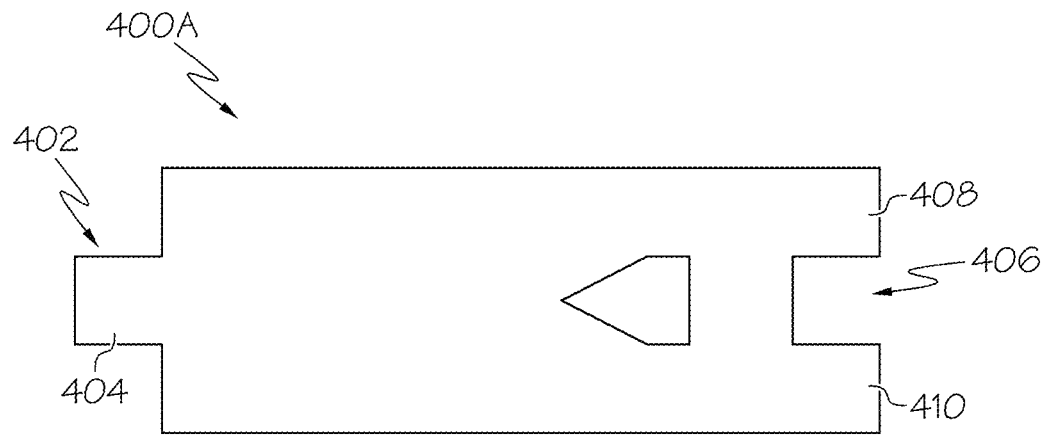
FIG. 5A shows an example fluid diode of the fluid diode array of FIGS. 4A and 4B, according to one or more embodiments shown or described herein.
Figure 5B:
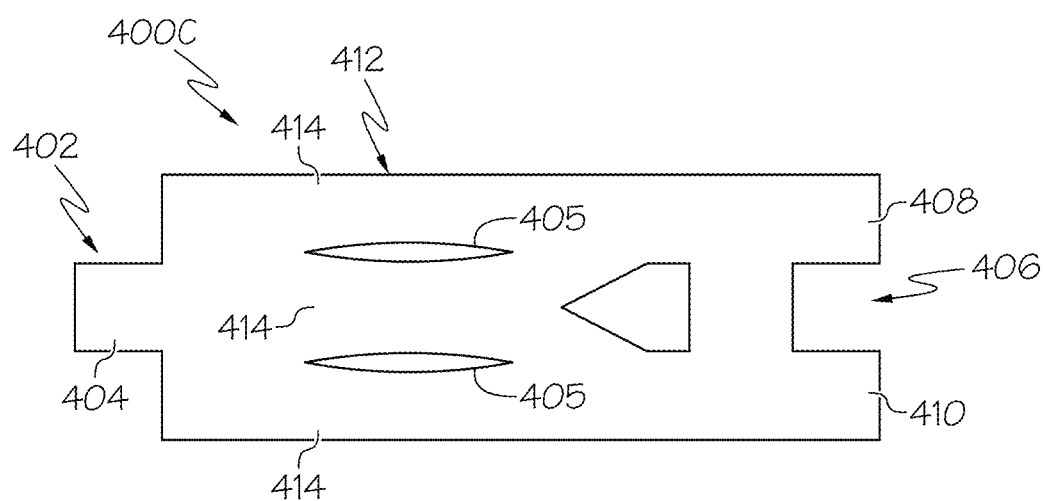
FIG. 5B shows another example fluid diode of the fluid diode array of FIGS. 4A and 4B having a higher diodicity than the example fluid diode of FIG. 5A, according to one or more embodiments shown or described herein.

Referring now to FIGS. 5A and 5B, plan views of the fluid diode 400A (FIG. 5A), which is one of the first set of fluid diodes, and the fluid diode 400C (FIG. 5B), which is one of the second set of fluid diodes, a schematically depicted. Both the fluid diode 400A and 400C comprise an inlet end 402 comprising one or more inlet flow channels 404 and an outlet end 406 comprising two or more outlet flow channels 408, 410, where the fluid diodes 400A, 400C each comprise a greater number of outlet flow channels 408, 410 than inlet flow channels 404. The fluid diodes 400A and 400C further comprise an intermediate portion 412 extending between the inlet flow channels 404 and the outlet flow channels 408, 410. The intermediate portion 412 of fluid diode 400C includes flow features 405. The flow features 405 in FIG. 5B are channel separators, which create intermediate flow channels 414 in the intermediate portion 412 of the fluid diode 400C, for example, three intermediate flow channels 414 formed by two flow features 405. The flow features 405 increase the diodicity of the fluid diode 400C when compared to fluid diode 400A.

The diodicity of the fluid diode 400C may be further increased by increasing the length and/or the width of the flow features 405 and the diodicity of the fluid diode 400C may be decreased by decreasing the length and/or the width of the flow features 405. Adding more flow features 405 may also increase the diodicity of the fluid diode 400C. Accordingly, the diodicities of the various fluid diodes of the fluid diode array 400 may be adjusted by adjusting the length, width, and/or number of flow features 405 of each of the fluid diodes. As such, the diodicities of the fluid diodes of the fluid diode array 400 may be tuned to match the heating profile of the heat generating electronic device 104.

The fluid diode 400A may be positioned at the channel inlet 301 of the heat sink fluid channel 302A of the cooling manifold 112 by connecting the outer edges of the outlet flow channels 408, 410 of the fluid diode 400A to the inner edges of the projections 300A, 300B. The fluid diode 400C may be positioned at the channel inlet 301 of the heat sink fluid channel 302C of the cooling manifold 112 by connecting the outer edges of the outlet flow channels 408, 410 of the fluid diode 400C to the inner edges of the projections 300C, 300D. In other embodiments, the fluid diodes 400A, 400C may be positioned at the channel inlets 301 of the heat sink fluid channels 302A, 302C in any other suitable manner.

When the fluid diode 400A is positioned at the inlet of a fluid channel of the cooling manifold 112, the inlet end 402 of the fluid diode 400A is positioned closer to the fluid inlet 200 of the cooling manifold 112 and the outlet end 406 of the fluid diode 400A is positioned closer to the fluid outlet 202 of the cooling manifold 112. Thus, cooling fluid flowing through the cooling manifold 112 in a forward flow direction enters the fluid diode 400A through the one or more inlet flow channels 404 and exits the fluid diode 400A through the two or more outlet flow channels 408, 410. Alternatively, cooling fluid flowing through the cooling manifold 112 in a reverse direction enters the fluid diode 400A through the two or more outlet flow channels 408, 410 and exits the fluid diode 400A through the one or more inlet flow channels 404. Thus, less pressure drop is required for forward flow through the cooling manifold 112 than for reverse flow.

In the illustrated example of FIGS. 4A and 4B, the first set of fluid diodes comprising fluid diodes 400A, 400B, 400E, 400F each have a structure as shown in FIG. 4A with no flow features, while the second set of fluid diodes comprising fluid diodes 400C, 400D each have a structure as shown in FIG. 5B with the flow features 405. Accordingly, because of the presence of the flow features 405, the fluid diodes 400C and 400D have a higher diodicity than the fluid diodes 400A, 400B, 400E, 400F. In other examples, the fluid diodes 400A. 400B. 400E. 400F may have the structure shown in FIG. 5B with smaller flow features 405 and the fluid diodes 400C, 400D may have the structure shown in FIG. 5B with larger flow features 405 (e.g., the flow features 405 may be longer and/or wider), more flow features 405, or a combination thereof. Indeed, the total volume of flow features 405 of fluid diodes 400C, 400D (i.e., the first set of fluid diodes) may be greater than the total volume of flow features of the fluid diodes fluid diodes 400A, 400B, 400E, 400F (the second set of fluid diodes). Accordingly, the fluid diodes having larger flow features 405 will have larger diodicities than the fluid diodes having smaller flow features 405.

Figure 6A:
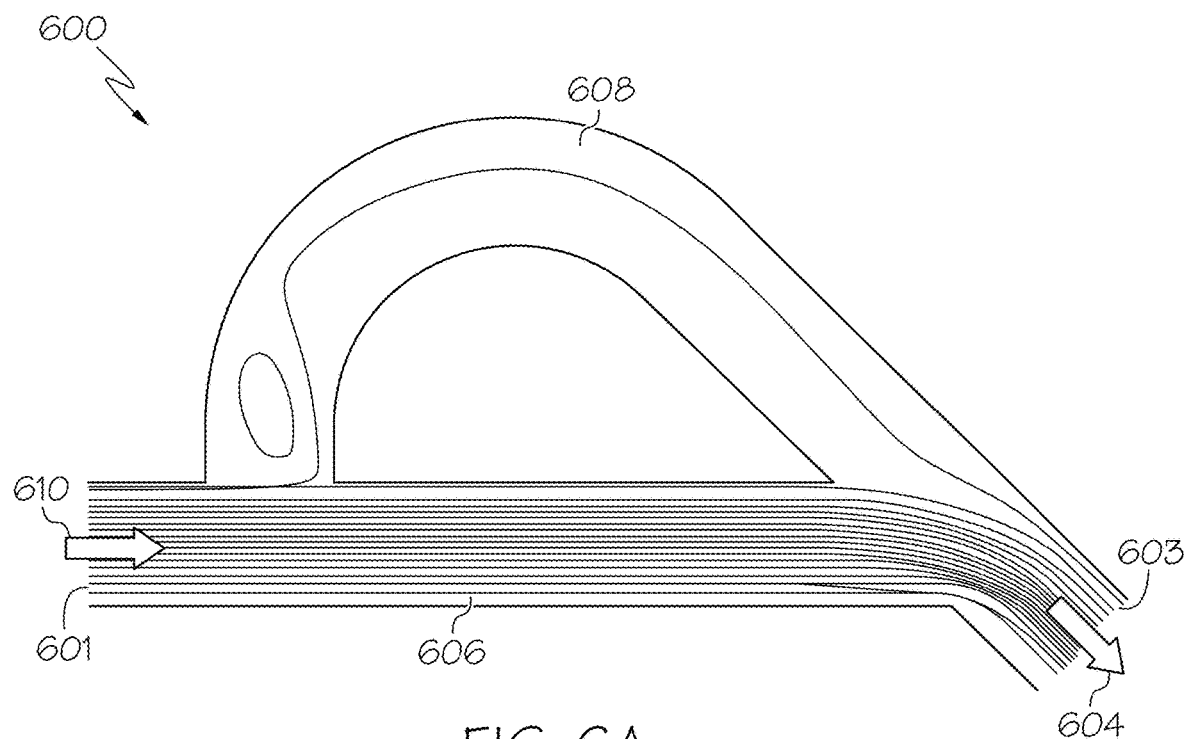
FIG. 6A shows another example fluid diode in a forward flow mode, according to one or more embodiments shown or described herein.
Figure 6B:
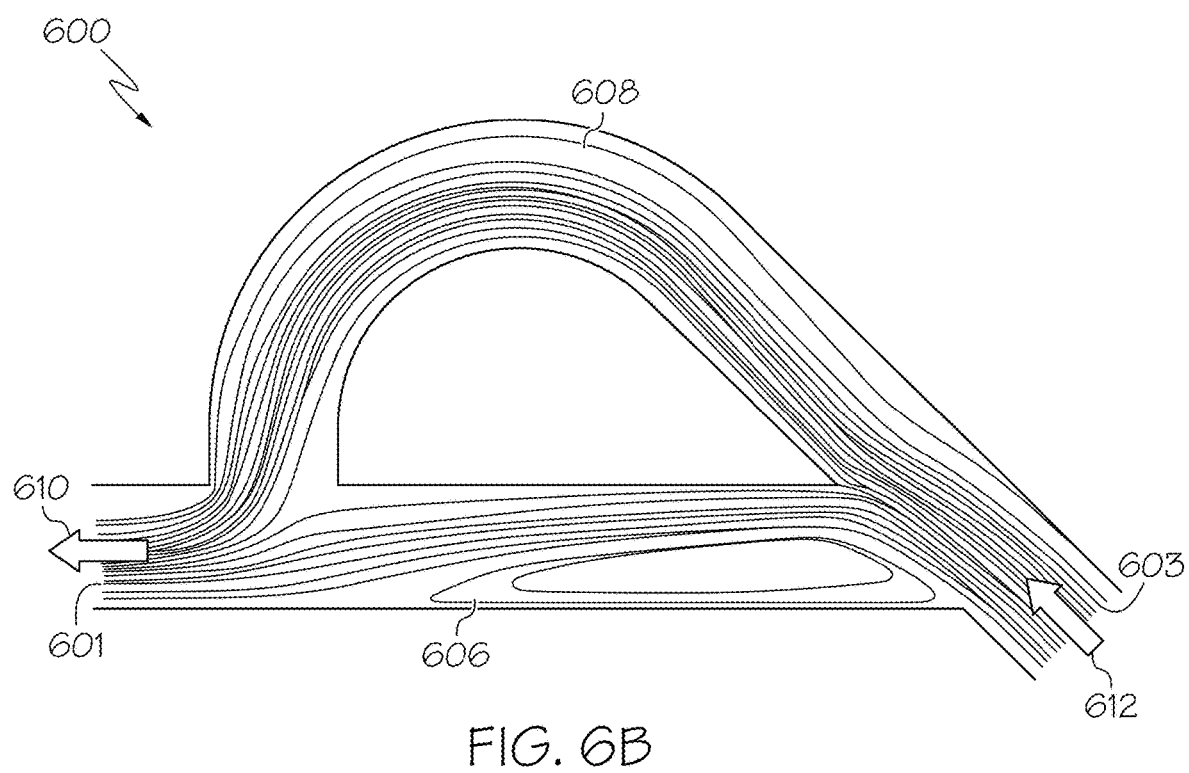
FIG. 6B shows the fluid diode of FIG. 6A in a reverse flow mode, according to one or more embodiments shown or described herein.

FIGS. 6A and 6B show cross-sectional views of another example fluid diode 600 that may be used in a fluid diode array of the cooling manifold 112. The fluid diode 600 comprises an inlet end 601, an outlet end 603, a straight lower portion 606, and a curved upper portion 608. The arrows 602, 604 in FIG. 6A show the direction of forward flow through the fluid diode 600 and the arrows 610, 612 of FIG. 6B show the direction of reverse flow through the fluid diode 600. During forward flow, fluid enters the fluid diode 600 through the inlet end 601, moves through the lower portion 606, and exits through the outlet end 603. During reverse flow, fluid enters the fluid diode 600 through the outlet end 603, moves through both the lower portion 606 and the upper portion 608, and exits through the inlet end 601. Accordingly, fluid more easily travels through the fluid diode 600 in the forward direction than the reverse direction.

The diodicity of the fluid diode 600 may be increased by increasing the angle by which the upper portion 608 extends from the lower portion 606 near the outlet end 603. Accordingly, a fluid diode array may comprise a plurality of fluid diodes 600, with each fluid diode 600 having a different diodicity based on the position of each fluid diode 600 relative to the heat generating electronic device 104 and the heating profile of the heat generating electronic device 104. In some embodiments, the cooling manifold 112 may comprise a fluid diode array having a variety of fluid diodes including any of the fluid diodes 400A, 400C, 600, or other fluid diodes having other shapes or structures.

It should now be understood that embodiments described herein are directed to microchannel two-phase cooling systems that include an array of fluid diodes having variable diodicities for cooling heat generating devices, such as power semiconductor devices. In particular, fluid diodes may be positioned at the channel inlets of heat sink fluid channels of the cooling system to prevent boiling instabilities of a cooling fluid from causing fluid backflow. Fluid diodes positioned at channel inlets of heat sink fluid channels that are more likely to experience boiling instabilities may have a higher diodicity than fluid diodes positioned at inlet ends of heat sink fluid channels that are less likely to experience boiling instabilities. As a result, the cooling apparatus permits power electronics devices to have a more efficient cooling scheme, resulting in more versatility in electronic packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A microchannel two-phase cooling apparatus comprising:
   a cooling manifold comprising one or more fluid inlets, one or more fluid outlets, and a plurality of heat sink fluid channels extending between and fluidly coupling the one or more fluid inlets and the one or more fluid outlets; and
   a fluid diode array comprising a plurality of fluid diodes positioned within the cooling manifold, wherein:
      individual fluid diodes of the fluid diode array are fluidly coupled to channel inlets of individual heat sink fluid channels of the plurality of heat sink fluid channels;
      the fluid diode array comprises a first set of fluid diodes comprising a first average diodicity, and a second set of fluid diodes comprising a second average diodicity; and
      the first average diodicity is greater than the second average diodicity and each individual fluid diode of the first set of fluid diodes has a greater diodicity than any individual fluid diode of the second set of fluid diodes.

2. The microchannel two-phase cooling apparatus of claim 1, wherein the heat sink fluid channels comprise linear heat sink fluid channels.

3. The microchannel two-phase cooling apparatus of claim 1, wherein the first set of fluid diodes are positioned in the center of the fluid diode array.

4. The microchannel two-phase cooling apparatus of claim 1, wherein the plurality of fluid diodes are configured to restrict fluid flow in a reverse direction from the one or more fluid outlets to the one or more fluid inlets.

5. The microchannel two-phase cooling apparatus of claim 1, wherein:
   at least one fluid diode of the first set of fluid diodes and at least one fluid diode of the second set of fluid diodes each have an inlet end comprising one or more inlet flow channels and an outlet end comprising two or more outlet flow channels; and
   the at least one fluid diode of the first set of fluid diodes and the at least one fluid diode of the second set of fluid diodes comprise a greater number of outlet flow channels than inlet flow channels.

6. The microchannel two-phase cooling apparatus of claim 5, wherein:
   at least one fluid diode of the first set of fluid diodes comprises one or more flow features fluidly coupled to the one or more inlet flow channels; and
   the one or more flow features are configured such that the at least one fluid diode of the first set of fluid diodes has a greater diodicity than each individual fluid diode of the second set of fluid diodes.

7. The microchannel two-phase cooling apparatus of claim 5, wherein at least one fluid diode of the first set of fluid diodes and at least one fluid diode of the second set of fluid diodes each have an intermediate portion between the inlet end of the at least one fluid diode and the outlet end of the at least one fluid diode comprising three or more intermediate flow channels separated from one another by one or more flow features.

8. The microchannel two-phase cooling apparatus of claim 7, wherein the total volume of the one or more flow features of the first set of fluid diodes are larger than the total volume of the one or more flow features of the second set of fluid diodes.

9. The microchannel two-phase cooling apparatus of claim 1, wherein the fluid diode array is arranged with functionally graded diodicities.

10. A cooling system comprising:
a heat generating electronic device thermally coupled to a microchannel two-phase cooling apparatus, the microchannel two-phase cooling apparatus comprising:
a cooling manifold comprising one or more fluid inlets, one or more fluid outlets, and a plurality of heat sink fluid channels extending between and fluidly coupling the one or more fluid inlets and the one or more fluid outlets; and
a fluid diode array comprising a plurality of fluid diodes positioned within the cooling manifold, wherein:
individual fluid diodes of the fluid diode array are fluidly coupled to channel inlets of individual heat sink fluid channels of the plurality of heat sink fluid channels;
the fluid diode array comprises a first set of fluid diodes comprising a first average diodicity, and a second set of fluid diodes comprising a second average diodicity; and
the first average diodicity is greater than the second average diodicity and each individual fluid diode of the first set of fluid diodes has a greater diodicity than any individual fluid diode of the second set of fluid diodes.

11. The cooling system of claim 10, further comprising:
a pump fluidly coupled to an inlet end of the microchannel two-phase cooling apparatus and a condenser fluidly coupled to an outlet end of the microchannel two-phase cooling apparatus, wherein:
the pump is configured to pump a cooling fluid through the microchannel two-phase cooling apparatus; and
the condenser is configured to remove latent heat from the cooling fluid.

12. The cooling system of claim 10, wherein the first set of fluid diodes are positioned in the center of the fluid diode array.

13. The cooling system of claim 10, wherein:
at least one fluid diode of the first set of fluid diodes and at least one fluid diode of the second set of fluid diodes each have an inlet end comprising one or more inlet flow channels and an outlet end comprising two or more outlet flow channels; and
the at least one fluid diode of the first set of fluid diodes and the at least one fluid diode of the second set of fluid diodes comprise a greater number of outlet flow channels than inlet flow channels.

14. The cooling system of claim 13, wherein:
at least one fluid diode of the first set of fluid diodes comprises one or more flow features fluidly coupled to the one or more inlet flow channels; and
the one or more flow features are configured such that the at least one fluid diode of the first set of fluid diodes has a greater diodicity than each individual fluid diode of the second set of fluid diodes.

15. The cooling system of claim 10, wherein the fluid diode array is arranged with functionally graded diodicities.

16. The cooling system of claim 10, wherein:
the heat generating electronic device is configured to generate heat non-uniformly such that it generates one or more high heat regions; and
the first set of fluid diodes are positioned adjacent to the one or more high heat regions of the heat generating electronic device.

17. A method of cooling a heat generating electronic device, the method comprising:
pumping a cooling fluid through a cooling manifold of a microchannel two-phase cooling apparatus thermally coupled to the heat generating electronic device using a pump fluidly coupled to the cooling manifold, thereby removing heat from the heat generating electronic device and storing energy of the removed heat in latent heat of the cooling fluid, wherein:
the cooling manifold comprises one or more fluid inlets, one or more fluid outlets, and a plurality of heat sink fluid channels extending between and fluidly coupling the one or more fluid inlets and the one or more fluid outlets; and
the microchannel two-phase cooling apparatus further comprises a fluid diode array comprising a plurality of fluid diodes positioned within the cooling manifold, wherein:
individual fluid diodes of the fluid diode array are fluidly coupled to channel inlets of individual heat sink fluid channels of the plurality of heat sink fluid channels;
the fluid diode array comprises a first set of fluid diodes comprising a first average diodicity and a second set of fluid diodes comprising a second average diodicity; and
the first average diodicity is greater than the second average diodicity and each individual fluid diode of the first set of fluid diodes has a greater diodicity than any individual fluid diode of the second set of fluid diodes.

18. The method of claim 17, wherein:
the heat generating electronic device generates heat non-uniformly such that it generates one or more high heat regions; and
the first set of fluid diodes are positioned adjacent to the one or more high heat regions of the heat generating electronic device.

19. The microchannel two-phase cooling apparatus of claim 18, wherein the first set of fluid diodes are positioned in the center of the fluid diode array.

20. The method of claim 18, further comprising condensing the cooling fluid using a condenser fluidly coupled to the one or more fluid outlets of the cooling manifold subsequent to pumping the cooling fluid through the cooling manifold.

* * * * *